United States Patent
Aoshima et al.

(10) Patent No.: US 12,360,359 B2
(45) Date of Patent: Jul. 15, 2025

(54) MICROMIRROR DEVICE AND OPTICAL SCANNING DEVICE

(71) Applicant: FUJIFILM Corporation, Tokyo (JP)

(72) Inventors: Keisuke Aoshima, Kanagawa (JP); Ko Okada, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 694 days.

(21) Appl. No.: 17/717,444

(22) Filed: Apr. 11, 2022

(65) Prior Publication Data

US 2022/0326509 A1 Oct. 13, 2022

(30) Foreign Application Priority Data

Apr. 13, 2021 (JP) .................................. 2021-067816

(51) Int. Cl.
- G02B 26/10 (2006.01)
- G02B 7/182 (2021.01)
- G02B 26/08 (2006.01)

(52) U.S. Cl.
CPC ....... *G02B 26/0858* (2013.01); *G02B 7/1821* (2013.01); *G02B 26/105* (2013.01)

(58) Field of Classification Search
CPC ............. G02B 26/0858; G02B 26/105; G02B 26/101; G02B 26/0833
See application file for complete search history.

(56) References Cited

U.S. PATENT DOCUMENTS

| | | |
|---|---|---|
| 2011/0181933 A1 | 7/2011 | Kubo et al. |
| 2017/0210278 A1 | 7/2017 | Matsuno |
| 2017/0343795 A1 | 11/2017 | Grutzeck et al. |

(Continued)

FOREIGN PATENT DOCUMENTS

| | | |
|---|---|---|
| EP | 2 330 456 A1 | 6/2011 |
| JP | 2017-132281 A | 8/2017 |

(Continued)

OTHER PUBLICATIONS

Extended European Search Report for corresponding European Application No. 22167545.7, dated Sep. 2, 2022.

(Continued)

*Primary Examiner* — Joseph P Martinez
(74) *Attorney, Agent, or Firm* — Birch, Stewart, Kolasch & Birch, LLP

(57) ABSTRACT

The micromirror device includes: a movable portion having a mirror portion on which a reflecting surface for reflecting incident light is formed; a first support portion that is connected to the movable portion on a first axis located in a plane including the reflecting surface of the mirror portion in a stationary state, and that swingably supports the movable portion around the first axis; and a pair of first actuators that are connected to the first support portion and face each other across the first axis, each of which being a piezoelectric drive type first actuator that allows the movable portion to swing around the first axis, in which in a case where the movable portion swings around the first axis, at least a part of the first actuator swings around the first axis in a phase opposite to a phase of the movable portion, and assuming that a ratio of a rotation angle of the first actuator to a rotation angle of the movable portion is R, 0<R<1.00 is satisfied.

3 Claims, 18 Drawing Sheets

(56) References Cited

U.S. PATENT DOCUMENTS

2018/0067304 A1     3/2018   Hattass et al.
2021/0223539 A1*   7/2021   Naono ................. G02B 26/101

FOREIGN PATENT DOCUMENTS

| JP | 2018-41085 A | 3/2018 |
|----|--------------|--------|
| WO | WO 2010/035759 A1 | 4/2010 |
| WO | WO2020/085063 A1 | 4/2020 |
| WO | WO2022/049954 A1 | 3/2022 |

OTHER PUBLICATIONS

Japanese Office Action for corresponding Japanese Application No. 2021-067816, dated Jul. 2, 2024, with an English translation.
European Communication pursuant to Article 94(3) EPC for corresponding European Application No. 22 167 545.7, dated Jul. 17, 2024.

* cited by examiner

FIG. 11

| PARAMETER | SET VALUE | PARAMETER | SET VALUE |
|---|---|---|---|
| Lb1 | 1.019 mm | Rm | 0.750 mm |
| Wb1 | VARIABLE | Lb0 | 0.730 mm |
| Lm1 | VARIABLE | Wb0 | 0.220 mm |
| Lb2 | 0.575 mm | R0 | 0.230 mm |
| Wb2 | 0.130 mm | R1 | 0.065 mm |
| Lb3 | 0.700 mm | R2 | 0.075 mm |
| Wb3 | VARIABLE | R3 | 0.050 mm |
| Wm1 | 0.120 mm | $\delta 1$ | 0.040 mm |
| Wm2 | 0.225 mm | $\delta 2$ | 0.095 mm |
| $\Delta 1$ | VARIABLE | Wr1 | 0.165 mm |
| $\Delta 2$ | 0.085 mm | Wr2 | 0.125 mm |
| $\Delta 3$ | 0.056 mm | Wr3 | 0.148 mm |
| $\Delta 4$ | 0.056 mm | Xr1 | 1.376 mm |
| $\Delta 5$ | 0.100 mm | Xr2 | 0.990 mm |
| $\Delta 6$ | 0.070 mm | Xr3 | 1.159 mm |
| $\Delta 7$ | 0.075 mm | Wb1 | 0.132 mm |
| $\Delta 8$ | VARIABLE | Wrim2 | 0.070 mm |
| Wac1 | 0.985 mm | Wfrm | 0.136 mm |
| Wac2 | 0.450 mm | Rrim | 0.800 mm |
| Wac3 | VARIABLE | Rfrm | 0.870 mm |
| Wac4 | 0.625 mm | | |
| Wac5 | 0.300 mm | | |
| Wac6 | 0.225 mm | | |
| Xac1 | 2.625 mm | | |
| Xac2 | 1.145 mm | | |
| Yac1 | 2.625 mm | | |
| Yac2 | 0.945 mm | | |
| Wrim1 | 0.053 mm | | |
| $\theta$ rim | 15.5° | | |

FIG. 12

| MODEL NUMBER | Wb1 (mm) | Δ1 (mm) | Lm1 (mm) | Wac3 (mm) | Wb3 (mm) | Δ8 (mm) | DRIVING MODE | $f_{d1}$ (Hz) | $\theta ac$ (°) ($\theta m = \pm 17°$) | R ($R = \theta ac / \theta m$) | Q VALUE ($\theta m = \pm 17°$) |
|---|---|---|---|---|---|---|---|---|---|---|---|
| 1 | 0.23 | 0.07 | 0.325 | 0.175 | 0.06 | 0.25 | ANTI-PHASE ROTATION | 16652 | 1.47 | 0.09 | 485 |
| 2 | 0.23 | 0.07 | 0.325 | 0.175 | 0.28 | 0.14 | | 16967 | 1.91 | 0.11 | 511 |
| 3 | 0.11 | 0.13 | 0.325 | 0.325 | 0.45 | 0.055 | | 13086 | 3.82 | 0.22 | 581 |
| 4 | 0.09 | 0.14 | 0.325 | 0.325 | 0.45 | 0.055 | | 11887 | 5.24 | 0.31 | 627 |
| 5 | 0.08 | 0.145 | 0.325 | 0.325 | 0.45 | 0.055 | | 11288 | 6.90 | 0.41 | 663 |
| 6 | 0.07 | 0.15 | 0.325 | 0.325 | 0.45 | 0.055 | | 10870 | 9.25 | 0.54 | 653 |
| 7 | 0.06 | 0.155 | 0.325 | 0.325 | 0.45 | 0.055 | | 10404 | 16.25 | 0.96 | 447 |
| 8 | 0.05 | 0.16 | 0.325 | 0.325 | 0.45 | 0.055 | | 10171 | 29.24 | 1.72 | 227 |
| 9 | 0.23 | 0.07 | 0.525 | 0.325 | 0.45 | 0.055 | IN-PHASE ROTATION | 9200 | -10.34 | -0.61 | 130 |

| PARAMETER | SET VALUE (mm) | PARAMETER | SET VALUE (mm) |
|---|---|---|---|
| $R_m$ | 0.75 | $L_c$ | 0.8 |
| $L_a$ | 0.63825 | $W_c$ | 0.28 |
| $W_a$ | 0.185 | $L_g$ | 0.95 |
| $R_0$ | 0.17608 | $W_g$ | 0.3 |
| $\delta$ | 0.9 | $W_d$ | 0.16 |
| $W_b$ | 0.12 | $\Delta 1$ | 0.085 |
| $W_r$ | 0.12 | $\Delta 2$ | 0.05 |
| $X_{r1}$ | 1.23191 | $\Delta 3$ | 0.4 |
| $X_{r2}$ | 1.02796 | $\Delta 4$ | 0.25 |
| $X_{r3}$ | 1.14471 | $W_{ac}$ | 0.16 |
| $W_h$ | 0.065 | $X_{ac}$ | 2.415 |
| $R_s$ | 0.8 | $Y_{ac}$ | 2.515 |
| $W_f$ | 0.13 | $W_s$ | 0.05935 |
| $R_f$ | 1.045 | $\theta_s$ | 12.5 (°) |
| $L_X$ | 6.1 | $D_1$ | 0.350 |
| $L_Y$ | 6.1 | $D_2$ | 0.125 |
| | | $D_3$ | 0.060 |

MICROMIRROR DEVICE AND OPTICAL SCANNING DEVICE

CROSS-REFERENCE TO RELATED APPLICATIONS

The present application claims priority under 35 U.S.C. § 119 to Japanese Patent Application No. 2021-067816 filed on Apr. 13, 2021. The above application is hereby expressly incorporated by reference, in its entirety, into the present application.

BACKGROUND

1. Technical Field

The technique of the present disclosure relates to a micromirror device and an optical scanning device.

2. Description of the Related Art

A micromirror device (also referred to as a microscanner) is known as one of micro electro mechanical systems (MEMS) devices manufactured using the silicon (Si) microfabrication technique. Since the micromirror device is small and has low power consumption, it is expected to have a wide range of applications in laser displays, laser projectors, optical coherence tomography, and the like.

There are various drive methods for the micromirror device, and a piezoelectric drive method using deformation of a piezoelectric body is promising since the generated torque is higher than that in other methods and a high scan angle can be obtained. In particular, in a case where a high scan angle is required, such as in a laser display, a higher scan angle can be obtained by driving the micromirror device of the piezoelectric drive method by resonance drive.

A general micromirror device used in a laser display comprises a mirror portion and a piezoelectric actuator (see, for example, JP2017-132281 A). The mirror portion is swingable around a first axis and a second axis that are orthogonal to each other. The actuator allows the mirror portion to swing around the first axis and the second axis according to the driving voltage supplied from the outside. The above-described scan angle corresponds to a deflection angle of the mirror portion.

As performance indicators of the laser display, resolution and viewing angle are mentioned. The resolution and viewing angle are related to a swing frequency and a deflection angle of the mirror portion of the micromirror device. For example, in a laser display of a Lissajous scanning method, two-dimensional optical scanning is performed by allowing the mirror portion to swing sequentially at two different frequencies around the first axis and the second axis. The larger the deflection angle of the mirror portion, the larger the scanning area of light, and the larger the image can be displayed with the shorter optical path length.

The simplest method to increase the deflection angle of the mirror portion is to increase the driving torque by increasing the area of the actuator.

SUMMARY

However, as the area of the actuator increases, the size of the micromirror device increases, so that the micromirror device cannot be applied to a device requiring a small micromirror device, such as a laser display.

In addition, in the micromirror device using the resonance drive, there is a problem that the gain of the deflection angle with respect to the increase in area of the actuator is low for the following reasons. In the configuration of the micromirror device in the related art, the swing of the mirror portion is excited by the vertical motion or the bending motion of the actuator. In this case, the actuator and the mirror portion move in the same phase. In this case, the present applicant found that in a case where the mirror portion is swung in the gas, the airflow generated by the mirror portion pushing the surrounding gas aside hinders the motion of the actuator. In particular, in a case of a resonance drive type micromirror device, the above-described airflow becomes a main factor of energy dissipation during resonance, which causes a significant decrease in deflection angle of the mirror portion.

An object of the present disclosure is to provide a micromirror device and an optical scanning device which are small in size and can increase a deflection angle of a mirror portion in gas.

In order to achieve the object, a micromirror device of the present disclosure comprises: a movable portion having a mirror portion on which a reflecting surface for reflecting incident light is formed; a first support portion that is connected to the movable portion on a first axis located in a plane including the reflecting surface of the mirror portion in a stationary state, and that swingably supports the movable portion around the first axis; and a pair of first actuators that are connected to the first support portion and face each other across the first axis, each of which being a piezoelectric drive type first actuator that allows the movable portion to swing around the first axis, in which in a case where the movable portion swings around the first axis, at least a part of the first actuator swings around the first axis in a phase opposite to a phase of the movable portion, and assuming that a ratio of a rotation angle of the first actuator to a rotation angle of the movable portion is R, $0<R<1.00$ is satisfied.

It is preferable that $0.12<R<0.80$ is satisfied.

It is preferable that the movable portion includes a second support portion that is connected to the mirror portion on a second axis which is located in the plane including the reflecting surface of the mirror portion in the stationary state and is orthogonal to the first axis, and that swingably supports the mirror portion around the second axis, and a pair of movable frames that are connected to the second support portion and face each other across the second axis.

It is preferable that the micromirror device further comprises: a pair of second actuators that face each other across the second axis, each of which being a piezoelectric drive type second actuator that allows the mirror portion to swing around the second axis; and a first connecting portion that connects the first actuator and the second actuator.

It is preferable that the micromirror device further comprises: a fixed frame that surrounds the second actuator; and a second connecting portion that connects the second actuator and the fixed frame.

An optical scanning device of the present disclosure comprises: the micromirror device according to any one of the aspects described above; a processor that drives the first actuator and the second actuator, in which the processor allows the mirror portion to resonate around the first axis and the second axis by giving a driving signal to the first actuator and the second actuator.

According to the technique of the present disclosure, it is possible to provide a micromirror device and an optical scanning device which are small in size and can increase a deflection angle of a mirror portion in gas.

BRIEF DESCRIPTION OF THE DRAWINGS

Exemplary embodiments according to the technique of the present disclosure will be described in detail based on the following figures, wherein:

FIG. 11 is a diagram showing setting values of various parameters used in simulation, FIG. 12 is a diagram showing simulation results for a plurality of models.

DETAILED DESCRIPTION

An example of an embodiment relating to the technique of the present disclosure will be described with reference to the accompanying drawings.

Figure 1:
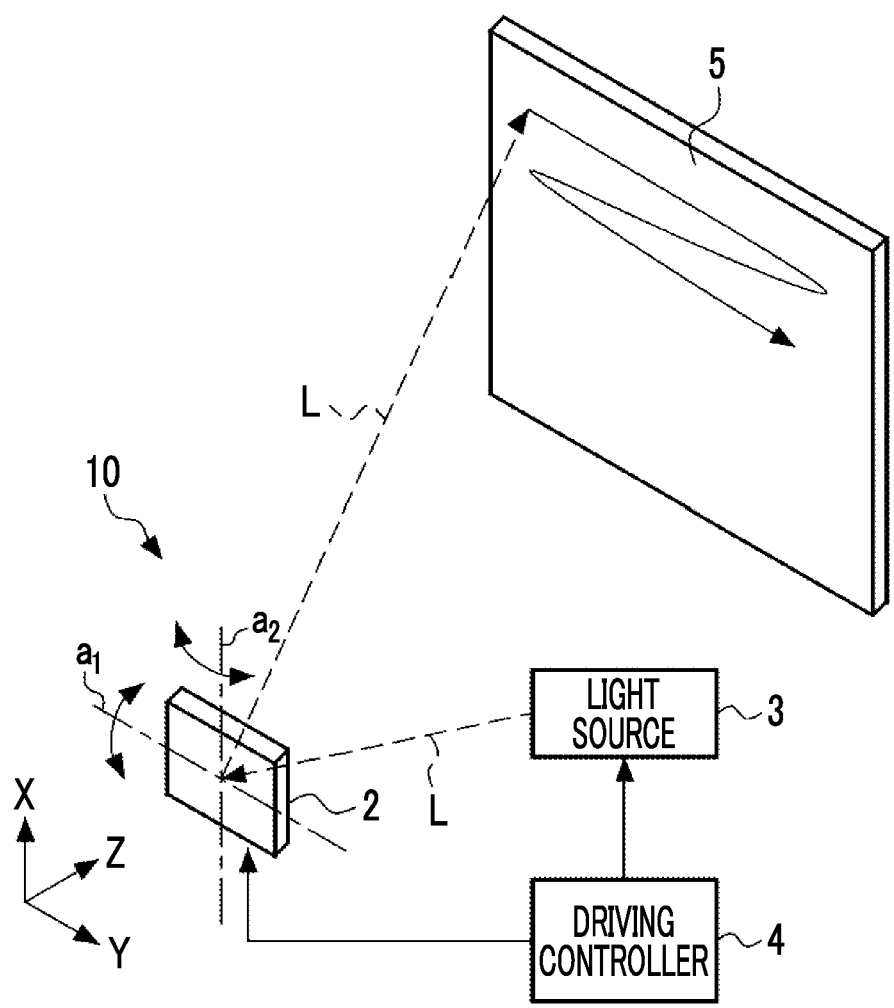
FIG. 1 is a schematic view of an optical scanning device.

FIG. 1 schematically shows an optical scanning device 10 according to an embodiment. The optical scanning device 10 includes a micromirror device (hereinafter, referred to as micromirror device (MMD)) 2, a light source 3, and a driving controller 4. The optical scanning device 10 optically scans a surface to be scanned 5 by reflecting a light beam L emitted from the light source 3 by the MMD 2 under the control of the driving controller 4. The surface to be scanned 5 is, for example, a screen.

The MMD 2 is a piezoelectric biaxial drive type micromirror device capable of allowing a mirror portion 20 (see FIG. 3) to swing around a first axis $a_1$ and a second axis $a_2$ orthogonal to the first axis $a_1$. Hereinafter, the direction parallel to the first axis $a_1$ is referred to as a Y direction, the direction parallel to the second axis $a_2$ is an X direction, and the direction orthogonal to the first axis $a_1$ and the second axis $a_2$ is referred to as a Z direction.

The light source 3 is a laser device that emits, for example, a laser beam as the light beam L. It is preferable that the light source 3 emits the light beam L perpendicularly to a reflecting surface 20A (see FIG. 3) included in the mirror portion 20 in a state where the mirror portion 20 of the MMD 2 is stationary.

The driving controller 4 outputs a driving signal to the light source 3 and the MMD 2 based on optical scanning information. The light source 3 generates the light beam L based on the input driving signal and emits the light beam L to the MMD 2. The MMD 2 allows the mirror portion 20 to swing around the first axis $a_1$ and the second axis $a_2$ based on the input driving signal.

As will be described in detail below, the driving controller 4 allows the mirror portion 20 to resonate around the first axis $a_1$ and the second axis $a_2$, so that the surface to be scanned 5 is scanned with the light beam L reflected by the mirror portion 20 such that a Lissajous waveform is drawn. This optical scanning method is called a Lissajous scanning method.

The optical scanning device 10 is applied to, for example, a Lissajous scanning type laser display. Specifically, the optical scanning device 10 can be applied to a laser scanning display such as augmented reality (AR) glass or virtual reality (VR) glass.

Figure 2:
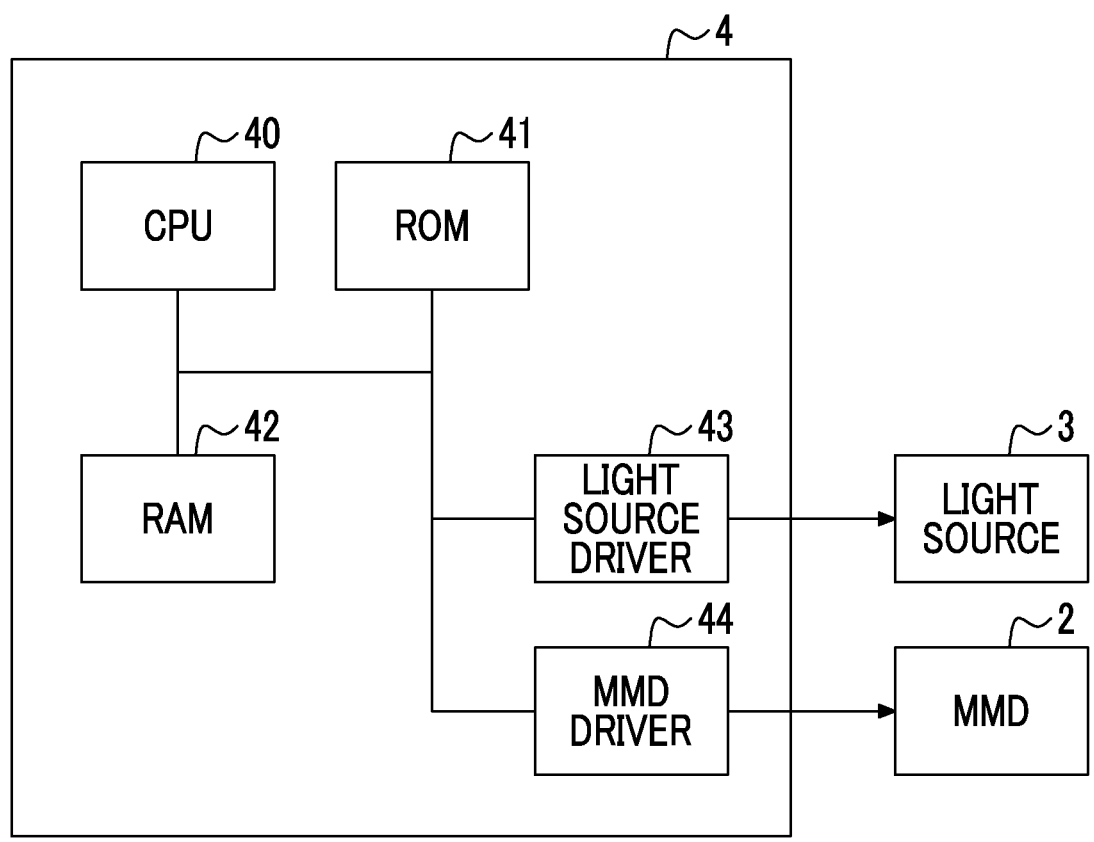
FIG. 2 is a block diagram showing an example of a hardware configuration of a driving controller.

FIG. 2 shows an example of a hardware configuration of the driving controller 4. The driving controller 4 has a central processing unit (CPU) 40, a read only memory (ROM) 41, a random access memory (RAM) 42, a light source driver 43, and an MMD driver 44. The CPU 40 is an arithmetic unit that realizes the entire function of the driving controller 4 by reading out a program and data from a storage device such as the ROM 41 into the RAM 42 and executing processing. The CPU 40 is an example of a "processor" according to the technique of the present disclosure.

The ROM 41 is a non-volatile storage device and stores a program for the CPU 40 to execute processing and data such as the optical scanning information described above. The RAM 42 is a volatile storage device that temporarily holds a program and data.

The light source driver 43 is an electric circuit that outputs a driving signal to the light source 3 under the control of the CPU 40. In the light source driver 43, the driving signal is a driving voltage for controlling the irradiation timing and the irradiation intensity of the light source 3.

The MMD driver 44 is an electric circuit that outputs a driving signal to the MMD 2 under the control of the CPU 40. In the MMD driver 44, the driving signal is a driving voltage for controlling the timing, cycle, and deflection angle for allowing the mirror portion 20 of the MMD 2 to swing.

The CPU 40 controls the light source driver 43 and the MMD driver 44 based on the optical scanning information. The optical scanning information is information including the scanning pattern of the light beam L with which the surface to be scanned 5 is scanned and the light emission timing of the light source 3.

Figure 3:
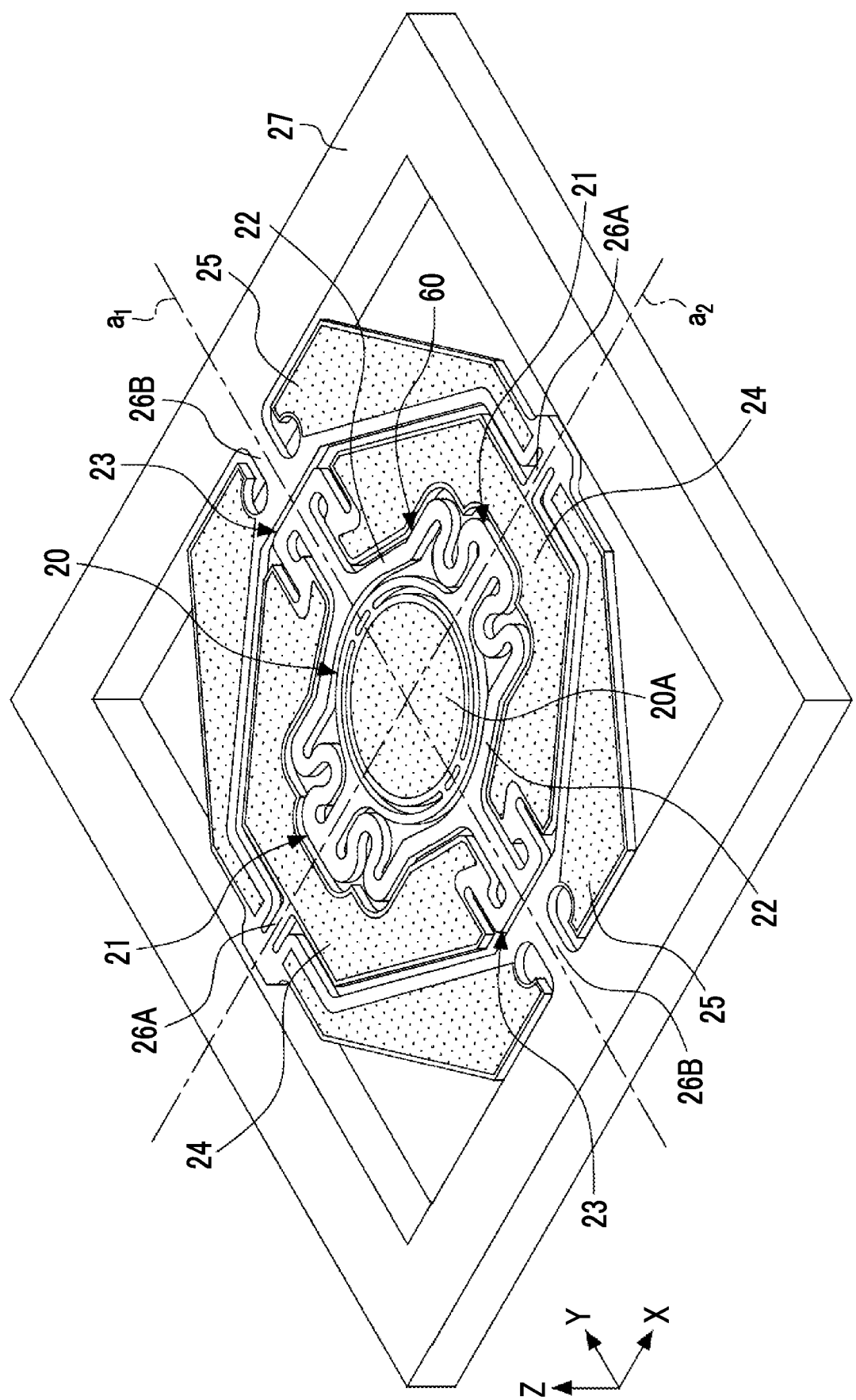
FIG. 3 is an external perspective view of a micromirror device.
Figure 4:
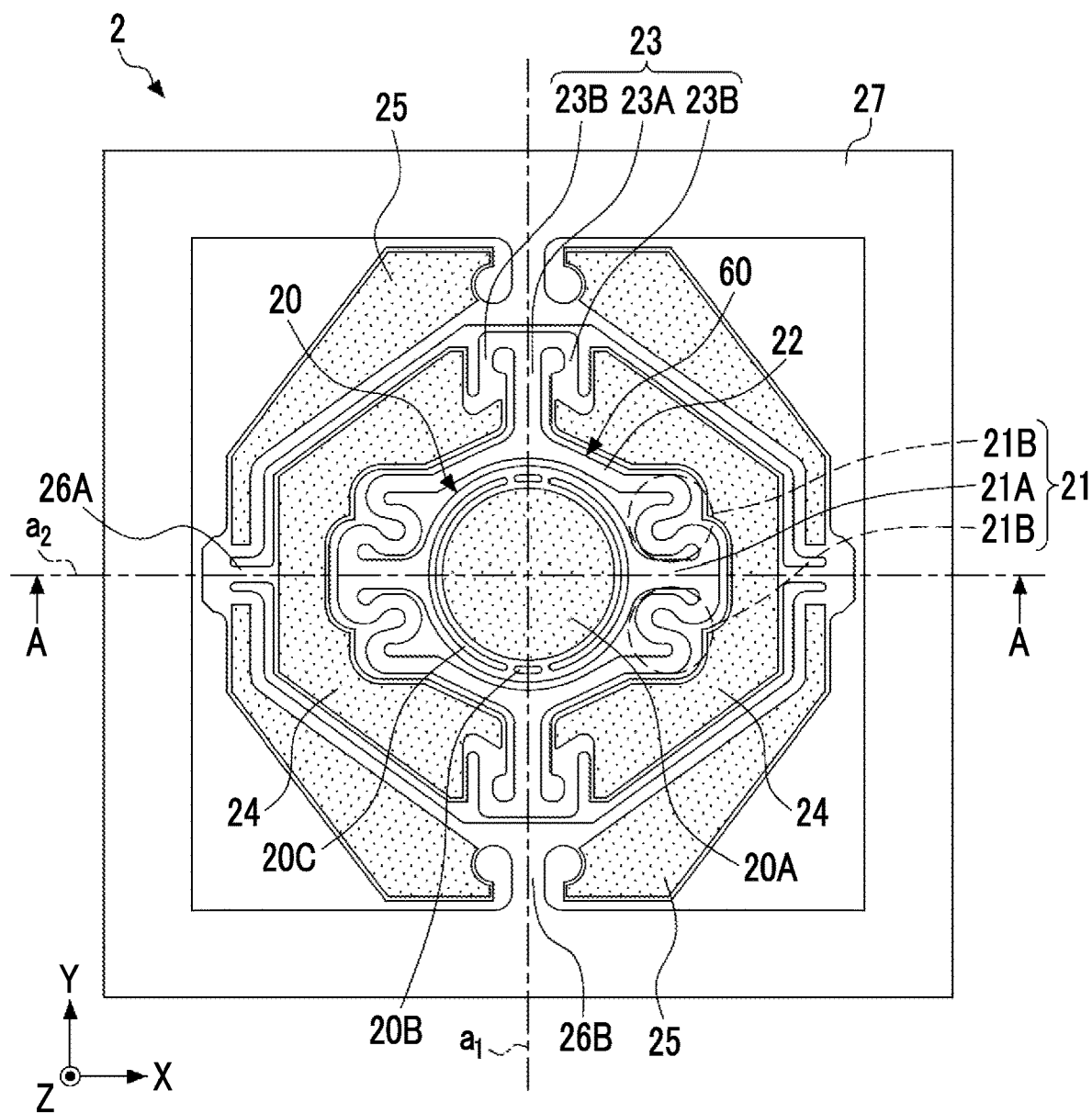
FIG. 4 is a plan view of the micromirror device as viewed from the light incident side.
Figure 5:
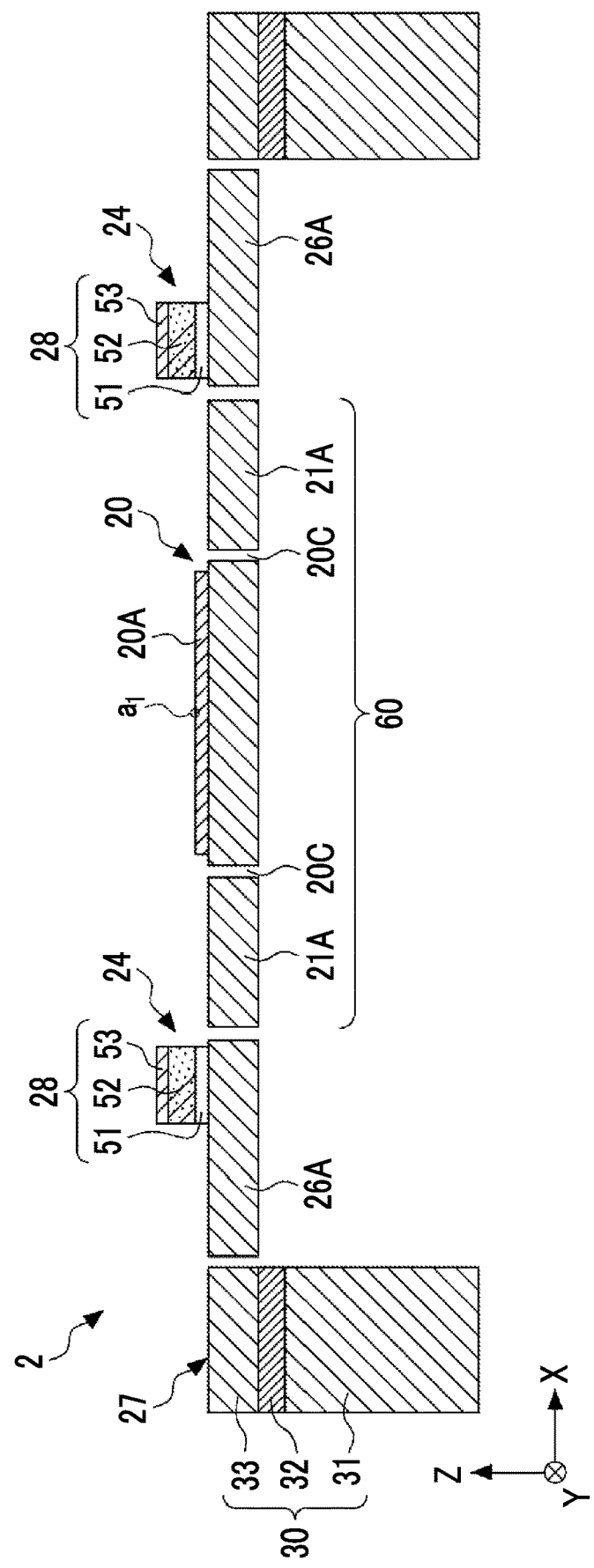
FIG. 5 is a cross-sectional view taken along the line A-A of FIG. 4.

Next, an example of the MMD 2 will be described with reference to FIGS. 3 to 5. FIG. 3 is an external perspective view of the MMD 2. FIG. 4 is a plan view of the MMD 2 as viewed from the light incident side. FIG. 5 is a cross-sectional view taken along the line A-A in FIG. 4.

As shown in FIG. 3, the MMD 2 has the mirror portion 20, a pair of support portions 21, a pair of movable frames 22, a pair of support portions 23, a pair of first actuators 24, a pair of second actuators 25, a pair of first connecting portions 26A, a pair of second connecting portions 26B, and a fixed frame 27. The MMD 2 is a so-called MEMS scanner. The support portion 23 is an example of a "first support portion" according to the technology of the present disclosure. The support portion 21 is an example of a "second support portion" according to the technology of the present disclosure.

The mirror portion 20 has a reflecting surface 20A for reflecting incident light. The reflecting surface 20A is formed of a metal thin film such as gold (Au) and aluminum (Al) provided on one surface of the mirror portion 20. The shape of the reflecting surface 20A is, for example, circular with the intersection of the first axis at and the second axis $a_2$ as the center.

The first axis $a_1$ and the second axis $a_2$ exist in a plane including the reflecting surface 20A in a case where the mirror portion 20 is stationary. The planar shape of the MMD 2 is rectangular, line-symmetrical with respect to the first axis $a_1$, and line-symmetrical with respect to the second axis $a_2$.

The pair of support portions 21 are disposed at positions facing each other across the first axis $a_1$, and have a shape that is line-symmetrical with respect to the first axis $a_1$. In addition, each of the support portions 21 has a shape that is line-symmetrical with respect to the second axis $a_2$. The support portion 21 is connected to the mirror portion 20 on the second axis $a_2$, and swingably supports the mirror portion 20 around the second axis $a_2$.

The pair of movable frames 22 are disposed at positions facing each other across the second axis $a_2$, and have a shape that is line-symmetrical with respect to the second axis $a_2$. Each of the movable frames 22 has a shape that is line-symmetrical with respect to the first axis $a_1$. In addition, each of the movable frames 22 is curved along the outer periphery of the mirror portion 20. Both ends of the movable frame 22 are connected to the support portion 21.

The support portion 21 and the movable frame 22 are connected to each other to surround the mirror portion 20. The mirror portion 20, the support portion 21, and the movable frame 22 constitute the movable portion 60.

The pair of support portions 23 are disposed at positions facing each other across the second axis $a_2$, and have a shape that is line-symmetrical with respect to the second axis $a_2$. Each of the support portions 23 has a shape that is line-symmetrical with respect to the first axis $a_1$. The support portion 23 is connected to the movable frame 22 on the first axis $a_1$, and swingably supports the movable portion 60 having the mirror portion 20 around the first axis $a_1$. In addition, both ends of the support portion 23 are connected to the first actuator 24.

The pair of first actuators 24 are disposed at positions facing each other across the first axis $a_1$, and have a shape that is line-symmetrical with respect to the first axis $a_1$. In addition, each of the first actuators 24 has a shape that is line-symmetrical with respect to the second axis $a_2$. The first actuator 24 is formed along the outer periphery of the support portion 21. The first actuator 24 is a piezoelectric drive type actuator comprising a piezoelectric element.

The support portion 23 and the first actuator 24 are connected to each other to surround the movable portion 60.

The pair of second actuators 25 are disposed at positions facing each other across the second axis $a_2$, and have a shape that is line-symmetrical with respect to the second axis $a_2$. In addition, each of the second actuators 25 has a shape that is line-symmetrical with respect to the first axis $a_1$. The second actuator 25 is formed along the outer periphery of the first actuator 24 and the support portion 23. The second actuator 25 is a piezoelectric drive type actuator comprising a piezoelectric element.

The second connecting portion 26B is formed at the center of each of the second actuators 25. In FIGS. 3 and 4, although it seems that the second actuator 25 is divided by the second connecting portion 26B, the second actuator 25 is electrically connected by a wiring line (not shown) provided in the second connecting portion 26B via the second connecting portion 26B.

The pair of first connecting portions 26A are disposed at positions facing each other across the first axis $a_1$, and have a shape that is line-symmetrical with respect to the first axis $a_1$. In addition, each of the first connecting portions 26A has a shape that is line-symmetrical with respect to the second axis $a_2$. The first connecting portion 26A is disposed along the second axis $a_2$, and connects the first actuator 24 and the second actuator 25 on the second axis $a_2$.

The pair of second connecting portions 26B are disposed at positions facing each other across the second axis $a_2$, and have a shape that is line-symmetrical with respect to the second axis $a_2$. In addition, each of the second connecting portions 26B has a shape that is line-symmetrical with respect to the first axis $a_1$. The second connecting portion 26B is disposed along the first axis $a_1$, and connects the second actuator 25 and the fixed frame 27 on the first axis $a_1$.

The second actuator 25 and the second connecting portion 26B are connected to each other to surround the movable portion 60 and the first actuator 24.

The fixed frame 27 is a frame-shaped member having a rectangular outer shape, and has a shape that is line-symmetrical with respect to each of the first axis $a_1$ and the second axis $a_2$. The fixed frame 27 surrounds the outer periphery of the second actuator 25 and the second connecting portion 26B. That is, the fixed frame 27 surrounds the first actuator 24. In addition, the second actuator 25 is disposed inside the fixed frame 27.

The first actuator 24 and the second actuator 25 are piezoelectric actuators each comprising a piezoelectric element. The pair of first actuators 24 allow the movable portion 60 having the mirror portion 20 to swing around the first axis $a_1$ by applying rotational torque around the first axis $a_1$ to the mirror portion 20 and the movable frame 22. The pair of second actuators 25 allow the mirror portion 20 to swing around the second axis as by applying rotational torque around the second axis $a_2$ to the mirror portion 20, the movable frame 22, and the first actuator 24.

As shown in FIG. 4, the support portion 21 is composed of a swing shaft 21A and a pair of coupling portions 21B. The swing shaft 21A is a so-called torsion bar stretched along the second axis $a_2$. One end of the swing shaft 21A is connected to the mirror portion 20, and the other end thereof is connected to the coupling portion 21B.

The pair of coupling portions 21B are disposed at positions facing each other across the second axis $a_2$, and have a shape that is line-symmetrical with respect to the second axis $a_2$. One end of the coupling portion 21B is connected to the swing shaft 21A, and the other end thereof is connected to the movable frame 22. The coupling portion 21B has a folded structure. Since the coupling portion 21B has elasticity due to the folded structure, the internal stress applied to the swing shaft 21A is relaxed in a case where the mirror portion 20 swings around the second axis $a_2$.

The support portion 23 is composed of a swing shaft 23A and a pair of coupling portions 23B. The swing shaft 23A is a so-called torsion bar stretched along the first axis $a_1$. One end of the swing shaft 23A is connected to the movable frame 22, and the other end thereof is connected to the coupling portion 23B.

The pair of coupling portions 23B are disposed at positions facing each other across the first axis $a_1$, and have a shape that is line-symmetrical with respect to the first axis $a_1$. One end of the coupling portion 23B is connected to the swing shaft 23A, and the other end thereof is connected to the first actuator 24. The coupling portion 23B has a folded structure. Since the coupling portion 23B has elasticity due to the folded structure, the internal stress applied to the swing shaft 23A is relaxed in a case where the mirror portion 20 swings around the first axis $a_1$.

In the mirror portion 20, a plurality of slits 20B and 20C are formed on the outside of the reflecting surface 20A along the outer periphery of the reflecting surface 20A. The plurality of slits 20B and 20C are disposed at positions that are line-symmetrical with respect to the first axis at and the second axis $a_2$, respectively. The slit 20B has an effect of suppressing distortion generated on the reflecting surface 20A due to the swing of the mirror portion 20.

In FIGS. 3 and 4, the wiring line and the electrode pad for giving the driving signal to the first actuator 24 and the second actuator 25 are not shown. A plurality of the electrode pads are provided on the fixed frame 27.

As shown in FIG. 5, the MMD 2 is formed, for example, by performing an etching treatment on a silicon on insulator (SOI) substrate 30. The SOI substrate 30 is a substrate in which a silicon oxide layer 32 is provided on a first silicon active layer 31 made of single crystal silicon, and a second silicon active layer 33 made of single crystal silicon is provided on the silicon oxide layer 32.

The mirror portion 20, the support portion 21, the movable frame 22, the support portion 23, the first actuator 24, the second actuator 25, the first connecting portion 26A, and the second connecting portion 26B are formed of the second silicon active layer 33 remaining by removing the first silicon active layer 31 and the silicon oxide layer 32 from the SOI substrate 30 by an etching treatment. The second silicon active layer 33 functions as an elastic portion having elasticity. The fixed frame 27 is formed of three layers of the first silicon active layer 31, the silicon oxide layer 32, and the second silicon active layer 33.

The first actuator 24 has a piezoelectric element 28 on the second silicon active layer 33. The piezoelectric element 28 has a laminated structure in which a lower electrode 51, a piezoelectric film 52, and an upper electrode 53 are sequentially laminated on the second silicon active layer 33. An insulating film is provided on the upper electrode 53, but is not shown. Although the configuration of the second actuator 25 is not shown in FIG. 5, the second actuator 25 has the same configuration as the first actuator 24.

The upper electrode 53 and the lower electrode 51 are formed of, for example, gold (Au) or platinum (Pt). The piezoelectric film 52 is formed of, for example, lead zirconate titanate (PZT), which is a piezoelectric material. The upper electrode 53 and the lower electrode 51 are electrically connected to the driving controller 4 described above via the wiring line and the electrode pad.

A driving voltage is applied to the upper electrode 53 from the driving controller 4. The lower electrode 51 is connected to the driving controller 4 via the wiring line and the electrode pad, and a reference potential (for example, a ground potential) is applied thereto.

In a case where a positive or negative voltage is applied to the piezoelectric film 52 in the polarization direction, deformation (for example, expansion and contraction) proportional to the applied voltage occurs. That is, the piezoelectric film 52 exerts a so-called inverse piezoelectric effect. The piezoelectric film 52 exerts an inverse piezoelectric effect by applying a driving voltage from the driving controller 4 to the upper electrode 53, and displaces the first actuator 24 and the second actuator 25.

Figure 6:
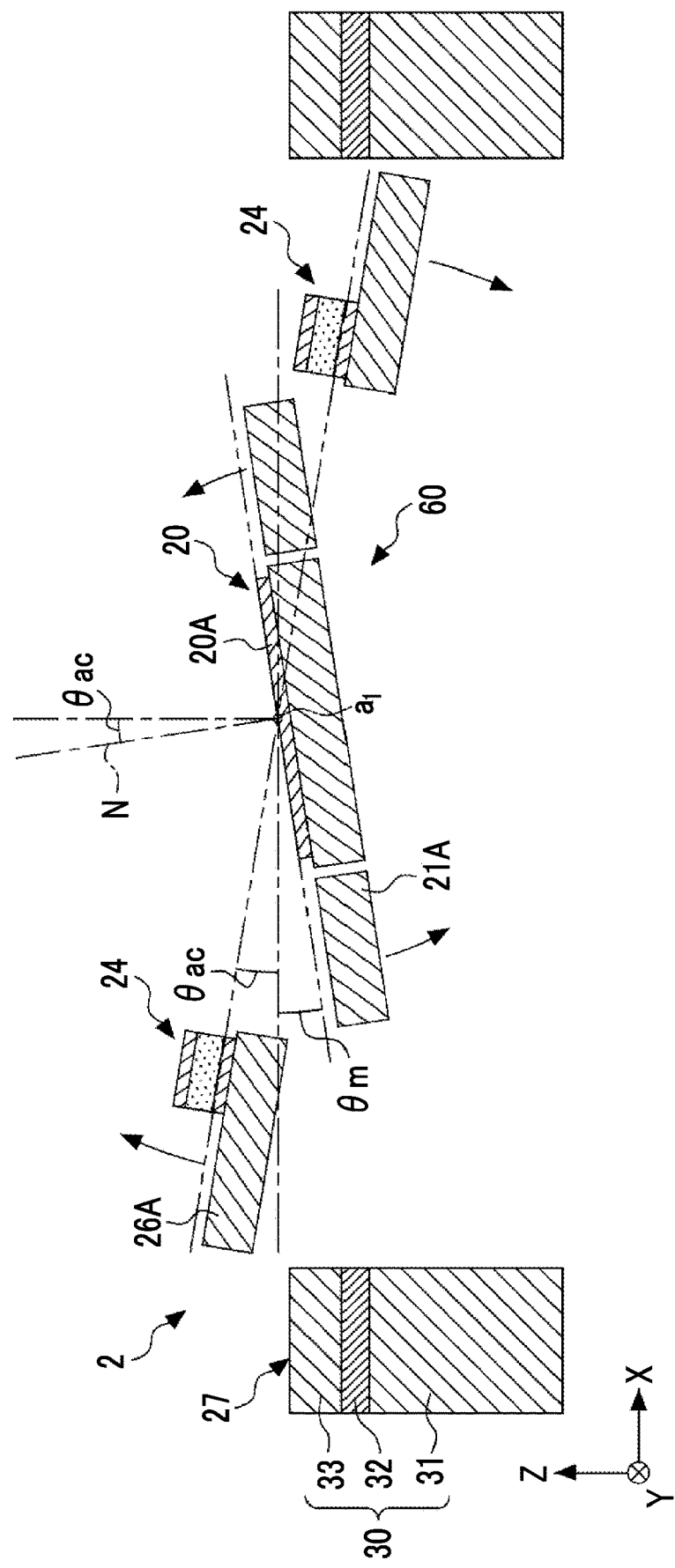
FIG. 6 is a diagram showing an example of driving a first actuator.

FIG. 6 shows an example in which one piezoelectric film 52 of the pair of first actuators 24 is extended and the other piezoelectric film 52 is contracted, thereby generating rotational torque around the first axis $a_1$ in the first actuator 24. In this way, one of the pair of first actuators 24 and the other are displaced in opposite directions to each other, whereby the movable portion 60 having the mirror portion 20 rotates around the first axis $a_1$.

In addition, FIG. 6 shows an example in which the first actuator 24 is driven in an anti-phase resonance mode (hereinafter, referred to as an anti-phase rotation mode) in which the displacement direction of the pair of first actuators 24 and the rotation direction of the movable portion 60 are opposite to each other. On the other hand, an in-phase resonance mode in which the displacement direction of the pair of first actuators 24 and the rotation direction of the movable portion 60 are the same direction is called an in-phase rotation mode. In the present embodiment, the first actuator 24 is driven in the anti-phase rotation mode. In the anti-phase rotation mode, in a case where the movable portion 60 swings around the first axis $a_1$, at least a part of the first actuator 24 swings in a phase opposite to a phase of the movable portion 60 around the first axis $a_1$.

A deflection angle θm of the mirror portion 20 around the first axis $a_1$ is controlled by the driving signal (hereinafter, referred to as a first driving signal) given to the first actuator 24 by the driving controller 4. The first driving signal is, for example, a sinusoidal AC voltage. The first driving signal includes a driving voltage waveform $V_{1A}$ (t) applied to one of the pair of first actuators 24 and a driving voltage waveform $V_{1B}$ (t) applied to the other. The driving voltage waveform $V_{1A}$ (t) and the driving voltage waveform $V_{1B}$ (t) are in an anti-phase with each other (that is, the phase difference is 180°).

The deflection angle θm of the mirror portion 20 around the first axis $a_1$ corresponds to an angle at which the normal line N of the reflecting surface 20A is inclined with respect to the Z direction in the YZ plane. Hereinafter, the deflection angle θm is also referred to as a rotation angle θm. θac shown in FIG. 6 indicates the rotation angle of the first actuator 24. The rotation angle θac corresponds to an angle at which the normal line to the surface of the first actuator 24 is inclined with respect to the Z direction in the YZ plane. Hereinafter, the ratio of the rotation angle θac of the first actuator 24 to the rotation angle θm of the movable portion 60 is referred to as an angle ratio R. That is, the angle ratio R is represented by R=θac/θm.

The second actuator 25 is driven in an anti-phase resonance mode in the same manner as the first actuator 24. A deflection angle of the mirror portion 20 around the second axis $a_2$ is controlled by the driving signal (hereinafter, referred to as a second driving signal) given to the second actuator 25 by the driving controller 4. The second driving signal is, for example, a sinusoidal AC voltage. The second driving signal includes a driving voltage waveform $V_{2A}$ (t) applied to one of the pair of second actuators 25 and a driving voltage waveform $V_{2B}$ (t) applied to the other. The driving voltage waveform $V_{2A}$ (t) and the driving voltage waveform $V_{2B}$ (t) are in an anti-phase with each other (that is, the phase difference is 180°).

Figure 7A:
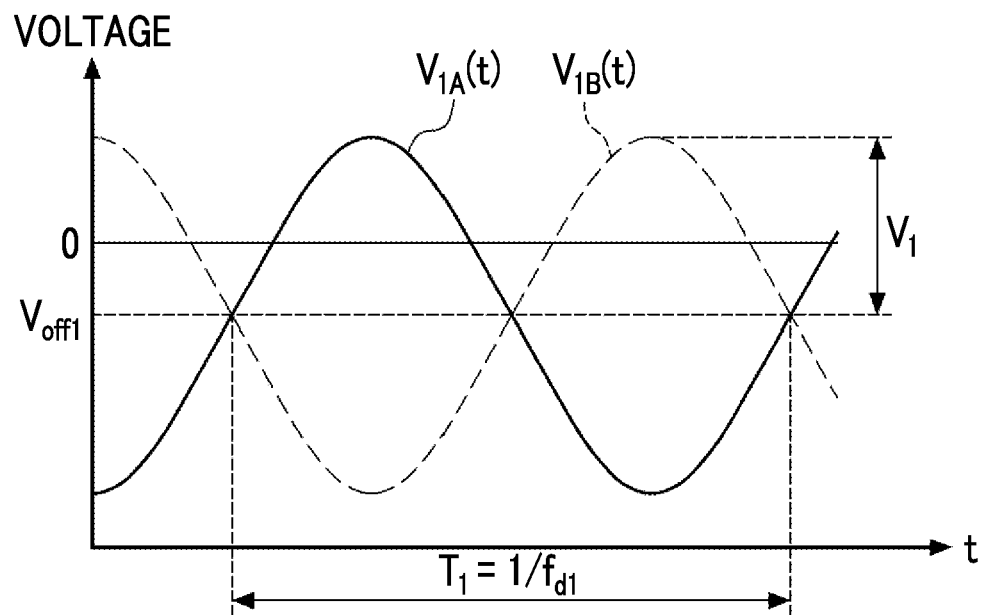
FIGS. 7A and 7B are diagrams showing examples of a first driving signal and a second driving signal.
Figure 7B:
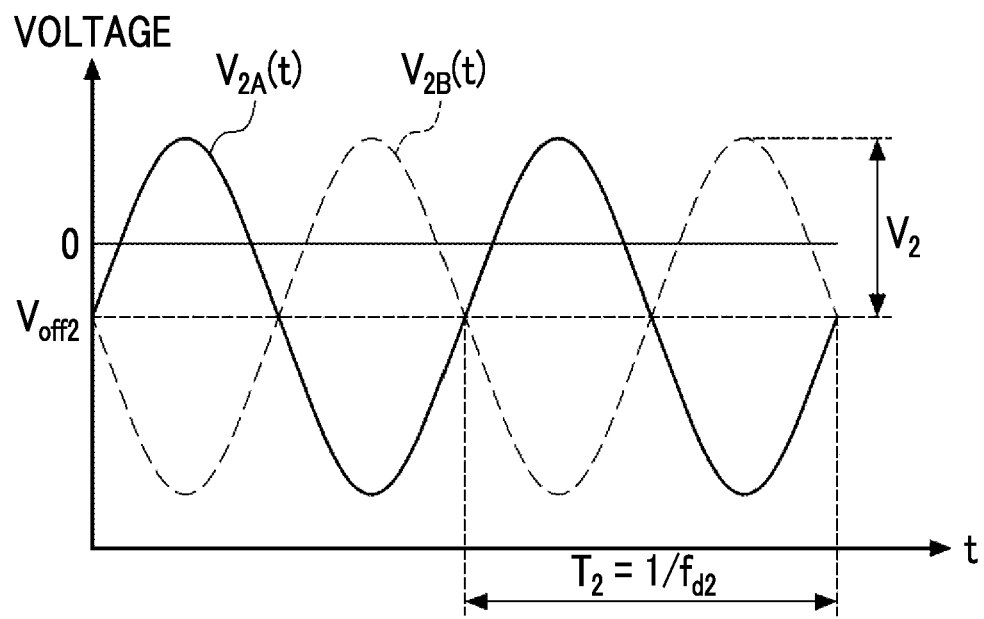

FIGS. 7A and 7B show examples of the first driving signal and the second driving signal. FIG. 7A shows the driving voltage waveforms $V_{1A}$ (t) and $V_{1B}$ (t) included in the first driving signal. FIG. 7B shows the driving voltage waveforms $V_{2A}$ (t) and $V_{2B}$ (t) included in the second driving signal.

The driving voltage waveforms $V_{1A}$ (t) and $V_{1B}$ (t) are represented as follows, respectively.

$$V_{1A}(t) = V_{off1} + V_1 \sin(2\pi f_{d1} t)$$

$$V_{1B}(t) = V_{off1} + V_1 \sin(2\pi f_{d1} t + \alpha)$$

Here, $V_1$ is the amplitude voltage. $V_{off1}$ is the bias voltage. $f_{d1}$ is the driving frequency (hereinafter, referred to as the first driving frequency). t is time. $\alpha$ is the phase difference between the driving voltage waveforms $V_{1A}$ (t) and $V_{1B}$ (t). In the present embodiment, for example, $\alpha=180°$.

By applying the driving voltage waveforms $V_{1A}$ (t) and $V_{1B}$ (t) to the pair of first actuators 24, the mirror portion 20 swings around the first axis $a_1$ at the first driving frequency $f_{d1}$.

The driving voltage waveforms $V_{2A}$ (t) and $V_{2B}$ (t) are represented as follows, respectively.

$$V_{2A}(t) = V_{off2} + V_2 \sin(2\pi f_{d2} t + \varphi)$$

$$V_{2B}(t) = V_{off2} + V_2 \sin(2\pi f_{d2} t + \beta + \varphi)$$

Here, $V_2$ is the amplitude voltage. $V_{off2}$ is the bias voltage. $f_{d2}$ is the driving frequency (hereinafter, referred to as the second driving frequency). t is time. $\beta$ is the phase difference between the driving voltage waveforms $V_{2A}$ (t) and $V_{2B}$ (t). In the present embodiment, for example, $\beta=180°$. In addition, $\varphi$ is the phase difference between the driving voltage waveforms $V_{1A}$ (t) and $V_{1B}$ (t) and the driving voltage waveforms $V_{2A}$ (t) and $V_{2B}$ (t). In the present embodiment, for example, $V_{off1} = V_{off2} = 0$ V.

By applying the driving voltage waveforms $V_{2A}$ (t) and $V_{2B}$ (t) to the pair of second actuators 25, the mirror portion 20 swings around the second axis $a_2$ at the second driving frequency $f_{d2}$.

The first driving frequency $f_{d1}$ is set so as to match the resonance frequency around the first axis $a_1$ of the mirror portion 20. The second driving frequency $f_{d2}$ is set so as to match the resonance frequency around the second axis $a_2$ of the mirror portion 20. In the present embodiment, $f_{d1} < f_{d2}$. That is, in the mirror portion 20, the swing frequency around the first axis $a_1$ is lower than the swing frequency around the second axis $a_2$.

In the MMD 2 configured as described above, it has been found that in a case where the mirror portion 20 swings around the first axis $a_1$, it is possible to increase the deflection angle θm of the mirror portion 20 in the gas by driving the first actuator 24 in the anti-phase rotation mode, rather than driving the first actuator 24 in the in-phase rotation mode.

Figure 8A:
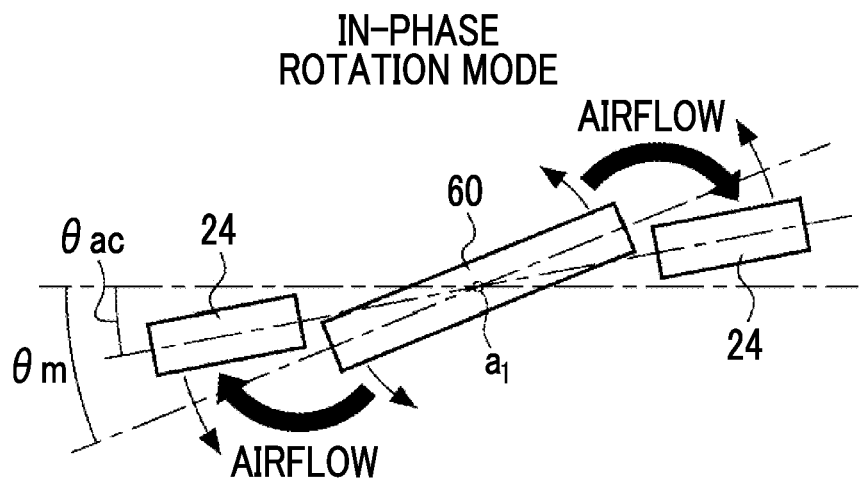
FIGS. 8A and 8B are diagrams showing an in-phase rotation mode and an anti-phase rotation mode.
Figure 8B:
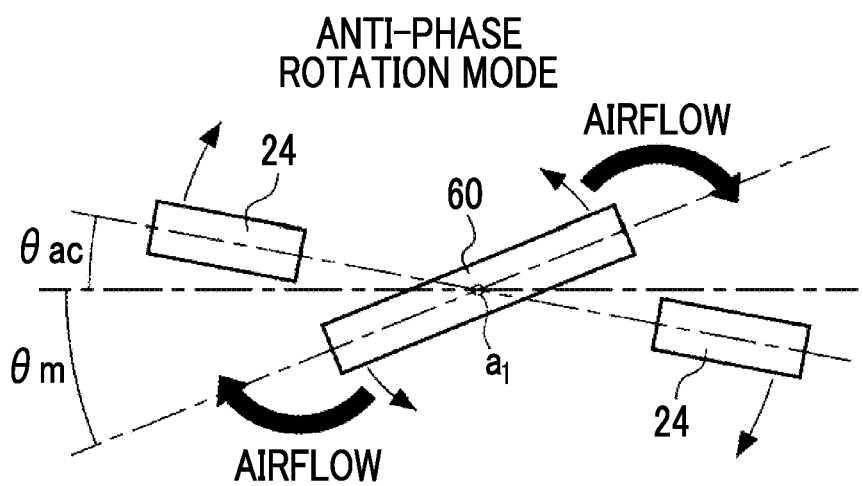

FIGS. 8A and 8B show the difference between the in-phase rotation mode and the anti-phase rotation mode. FIG. 8A shows the in-phase rotation mode. FIG. 8B shows the anti-phase rotation mode. In a case where the movable portion 60 rotates in the atmosphere, the airflow is generated by an end part of the movable portion 60 pushing the surrounding gas aside. This airflow is caused by the generation of a vortex and is directed to the first actuator 24 existing outside the movable portion 60.

As shown in FIG. 8A, in the in-phase rotation mode, the first actuator 24 rotates toward the airflow, so that the rotation is hindered by the airflow. That is, in the in-phase rotation mode, the dissipated energy due to the airflow that hinders the rotation of the first actuator 24 increases, and the Q value decreases. The Q value is a value representing the sharpness of resonance and is inversely proportional to the energy loss per cycle. In a case where the Q value decreases in this way, the deflection angle θm of the mirror portion 20 decreases.

As shown in FIG. 8B, in the anti-phase rotation mode, the first actuator 24 rotates away from the airflow, so that the rotation is less likely to be hindered by the airflow. That is, in the anti-phase rotation mode, the dissipated energy due to the airflow that hinders the rotation of the first actuator 24 decreases, and the Q value increases. In a case where the Q value increases in this way, the deflection angle θm of the mirror portion 20 can be increased even in a small MMD 2 having a small area of the first actuator 24 and a small driving torque.

The influence of the airflow is greater in a case where the mirror portion 20 swings around the first axis $a_1$ than in a case where the mirror portion 20 swings around the second axis aa. This is because the first actuator 24 is closer to the movable portion 60 than the second actuator 25, and is more susceptible to the influence of the air flow generated by the movable portion 60.

The present applicant found by simulation that the Q value increases by setting the above-described angle ratio R in a range of 0<R<1.00 and preferably in a range of 0.12<R<0.80 in the anti-phase rotation mode. Hereinafter, simulation based on the MMD 2 having the above configuration will be described.

Vibration Analysis Simulation

Figure 9:
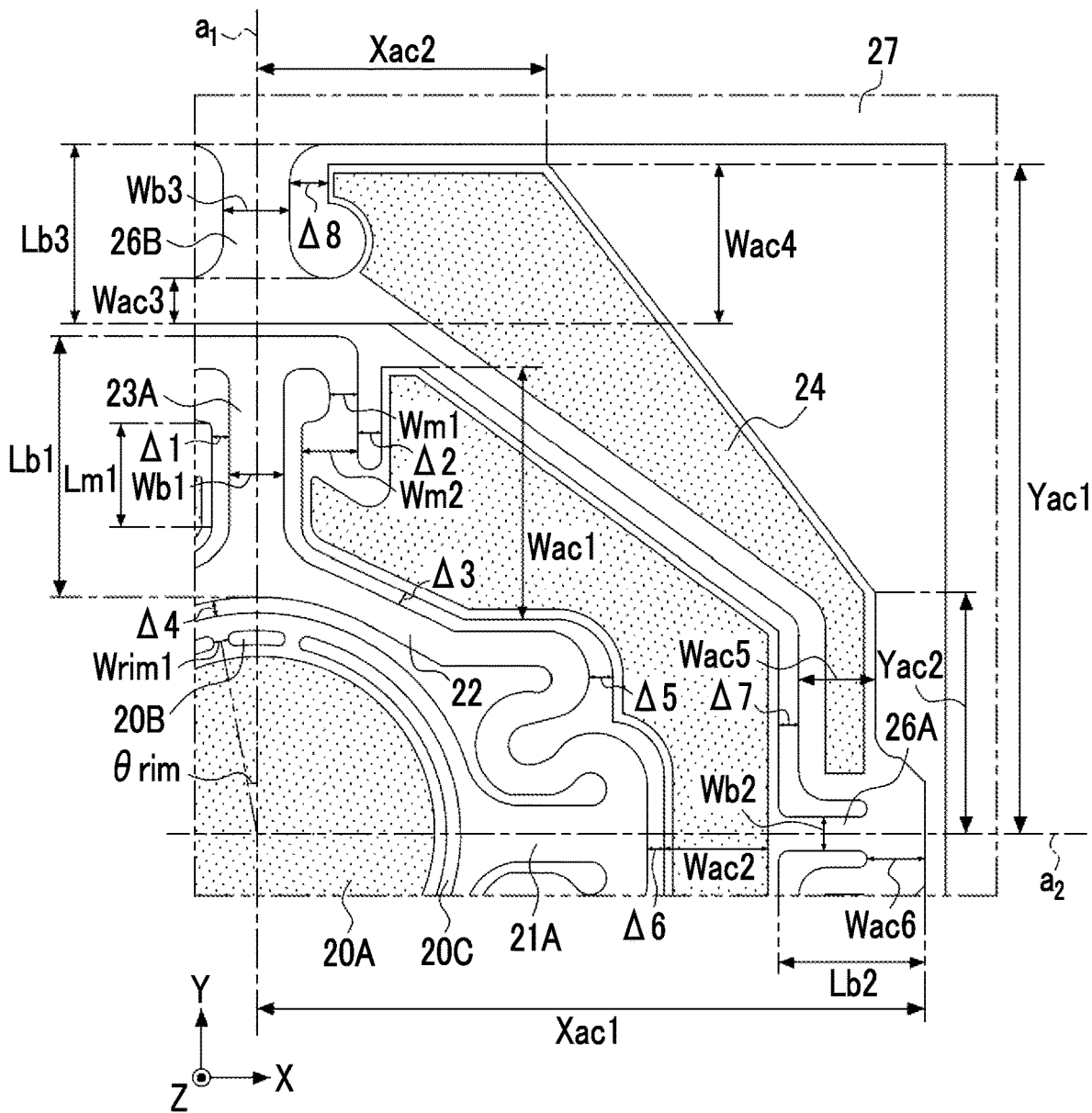
FIG. 9 is a diagram showing parameters relating to dimensions of components of the micromirror device.
Figure 10:
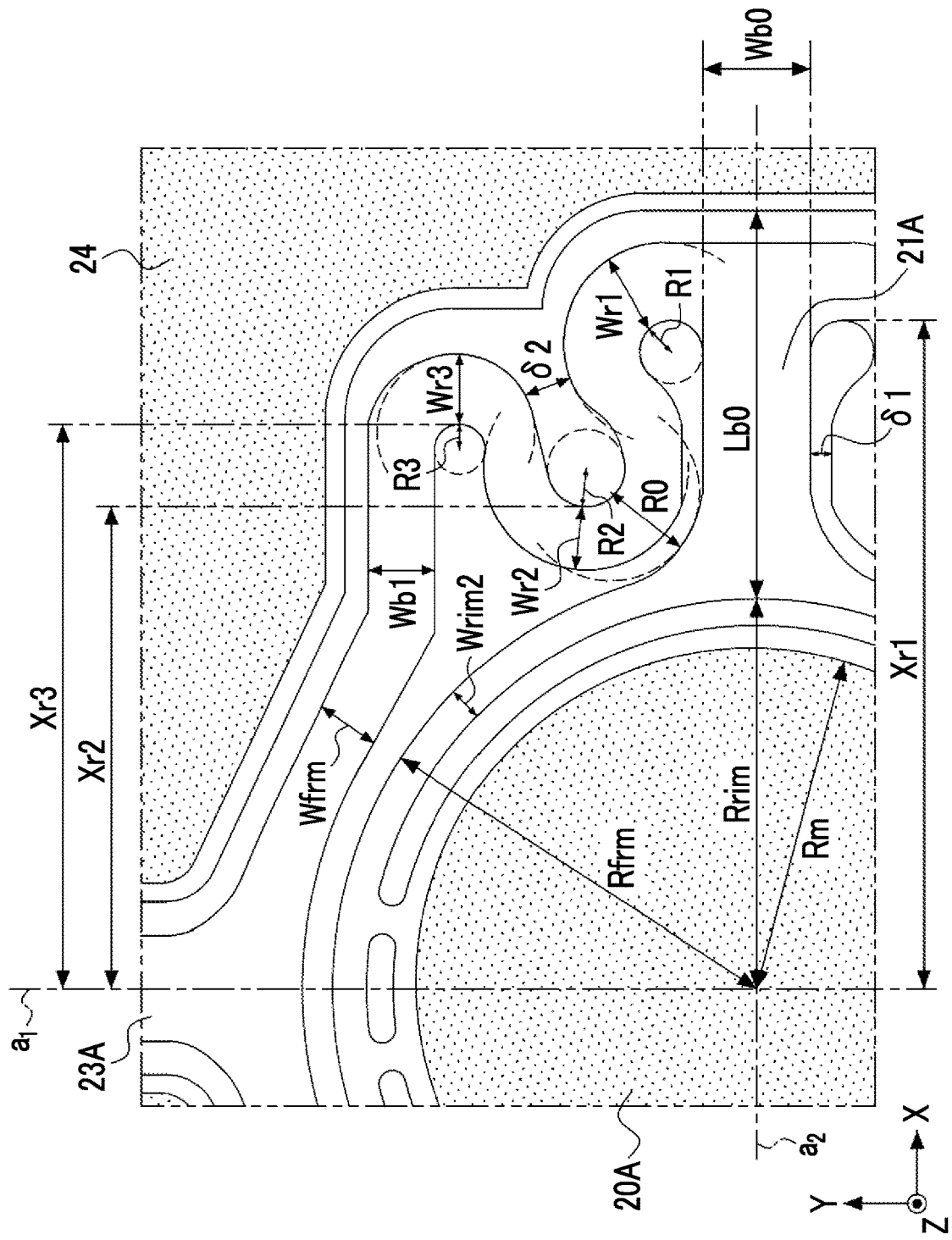
FIG. 10 is a diagram showing parameters relating to dimensions of components of the micromirror device.

FIGS. 9 and 10 show parameters relating to the width, length, and the like of the components of the MMD 2. FIG. 10 shows the set values of the parameters used in simulation. In the present simulation, only the first actuator 24 is driven without driving the second actuator 25. That is, the mirror portion 20 swings only around the first axis $a_1$.

In addition, in the present simulation, the diameter of the mirror portion 20 is 1.5 mm, the thickness of the SOI substrate 30 is 530 μm, and the thickness of the second silicon active layer 33 is 130 μm.

By using Wb1, Δ1, Lm1, Wac3, Wb3, and Δ8 among the parameters shown in FIG. 9 and the first driving frequency $f_{d1}$ as variables, the present applicant calculated the angle ratio R at θm=±17° by the resonance mode vibration analysis simulation by the finite element method. The positive/negative of the angle ratio R is defined to be positive in a case of the anti-phase rotation mode and negative in a case of the in-phase rotation mode. In addition, the present applicant calculated the Q value in the atmosphere by the half-width method.

FIG. 12 shows the simulation results. As shown in FIG. 12, the present applicant created nine models having different values of the above-described variables, and calculated the angle ratio R and the Q value for each model. In model numbers 1 to 8, the driving mode of the first actuator 24 is the anti-phase rotation mode. In model number 9, the driving mode of the first actuator 24 is the in-phase rotation mode.

Figure 13:
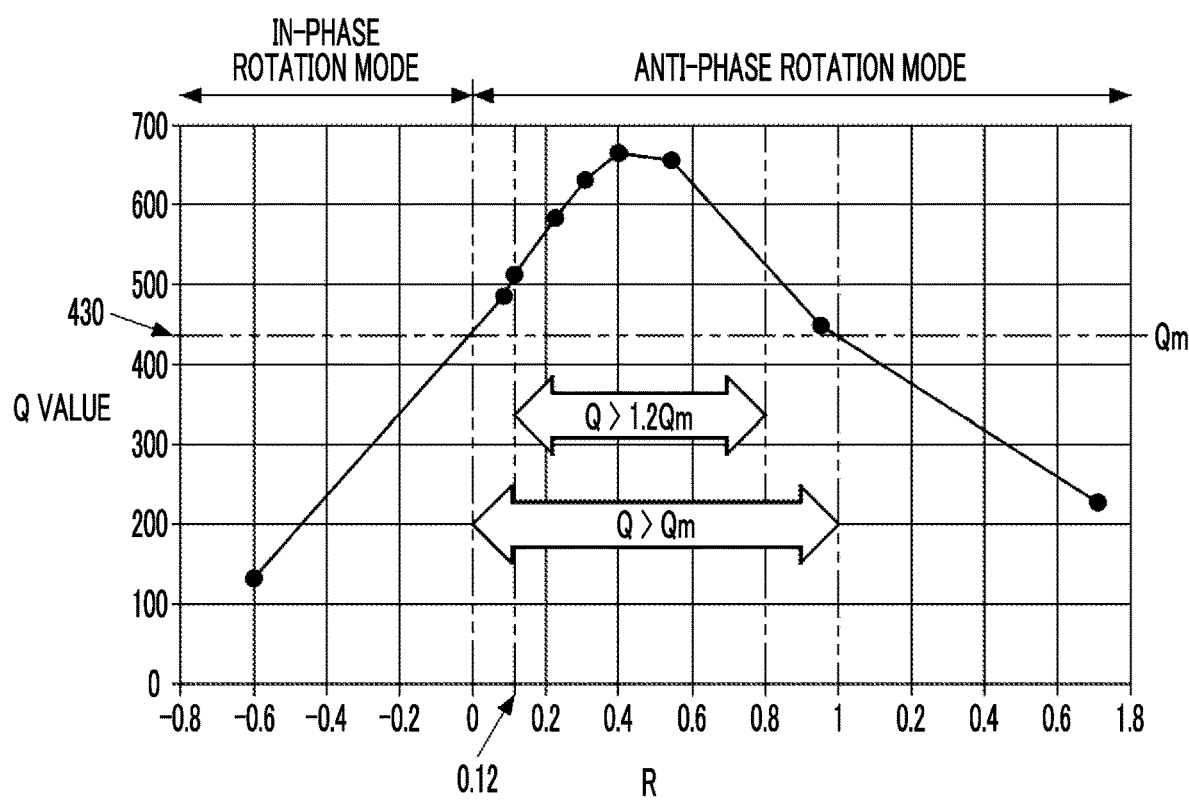
FIG. 13 is a graph showing a relationship between an angle ratio R and a Q value calculated by simulation.

FIG. 13 is a graph showing the relationship between the angle ratio R and the Q value calculated by the simulation. According to FIG. 13, it can be seen that the Q value becomes maximum in a case where the angle ratio R is around 0.4 to 0.6. Here, the Q value (about 430) around R=0 is a case where the displacement of the first actuator 24 is 0 (that is, θm=0). The Q value in this case is assumed to be equal to the Q value (hereinafter, referred to as the Qm value) in a case where the mirror portion of the same shape swings in the same frequency band by methods (electromagnetic drive method, electrostatic drive method, and the like) other than the piezoelectric drive method in which the actuator is not displaced.

Therefore, according to FIG. 13, by setting the angle ratio R in a range of 0<R<1.00 such that Q>Qm is obtained in the anti-phase rotation mode, an advantage is obtained in comparison with the other methods. Further, in order to obtain a certain or higher degree of advantage over the other methods, it is preferable to set the angle ratio R in a range of 0.12<R<0.80 such that Q>1.2 Qm is obtained on the basis of 1.2 times Qm.

In this way, by driving the first actuator 24 in the anti-phase rotation mode, the Q value can be increased without excessively increasing the area of the first actuator 24 for the purpose of increasing the driving torque. As a result, the deflection angle θm of the mirror portion 20 can be increased.

Comparative Example

Next, as Comparative Example, simulation using an MMD 2A in which the shape and the like of the components are different from those of the MMD 2 according to the above embodiment will be described.

Figure 14:
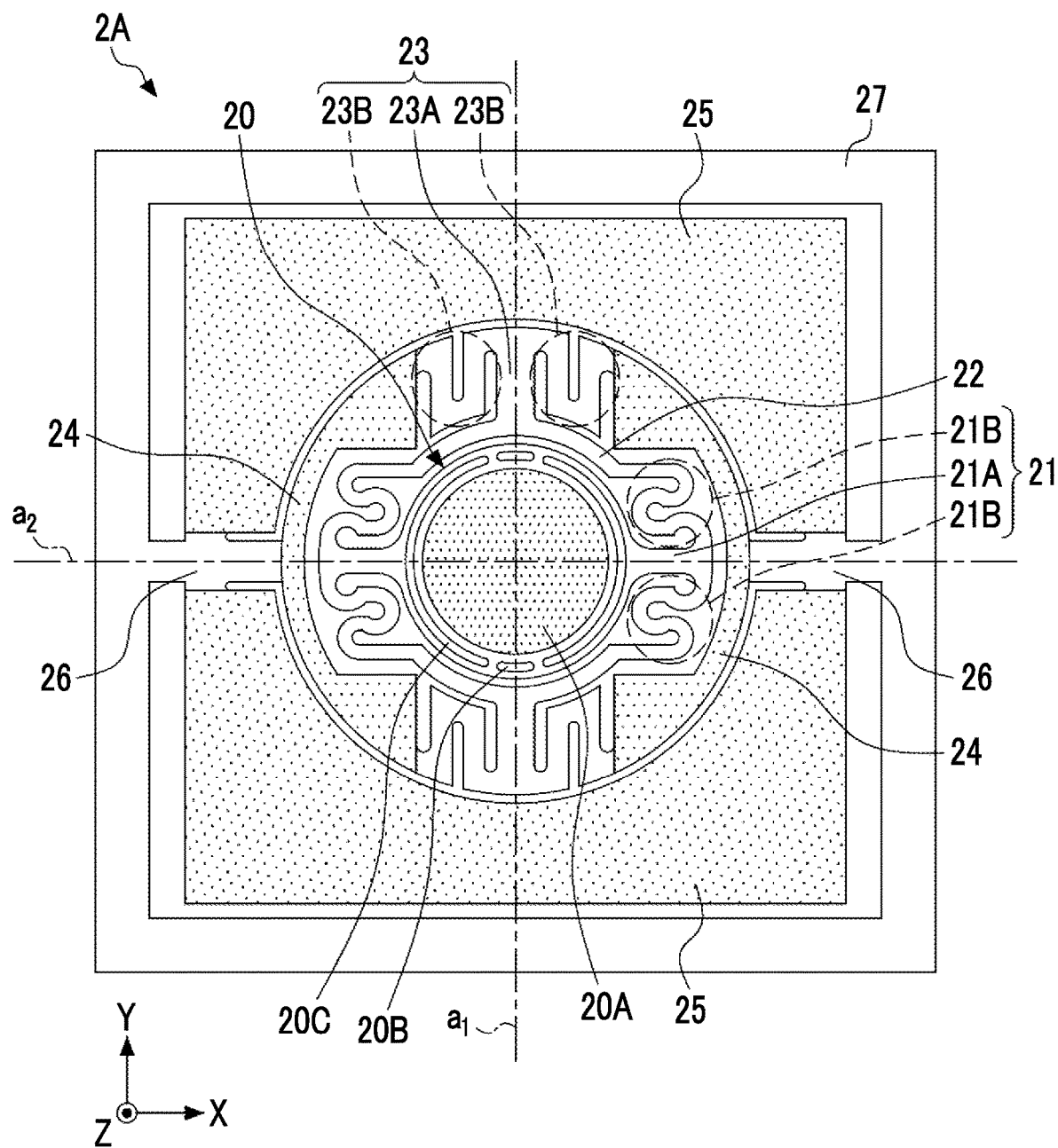
FIG. 14 is a plan view of a micromirror device according to Comparative Example.

FIG. 14 shows the configuration of the MMD 2A according to Comparative Example. In FIG. 14, the components having the same functions as those of the MMD 2 according to the above embodiment are designated by the same reference numerals. In the MMD 2A, a connecting portion 26 is provided instead of the first connecting portion 26A and the second connecting portion 26B. The connecting portion 26 is provided on the second axis $a_2$, and connects the first actuator 24 to the second actuator 25 and connects the second actuator 25 to the fixed frame 27.

Figure 15:
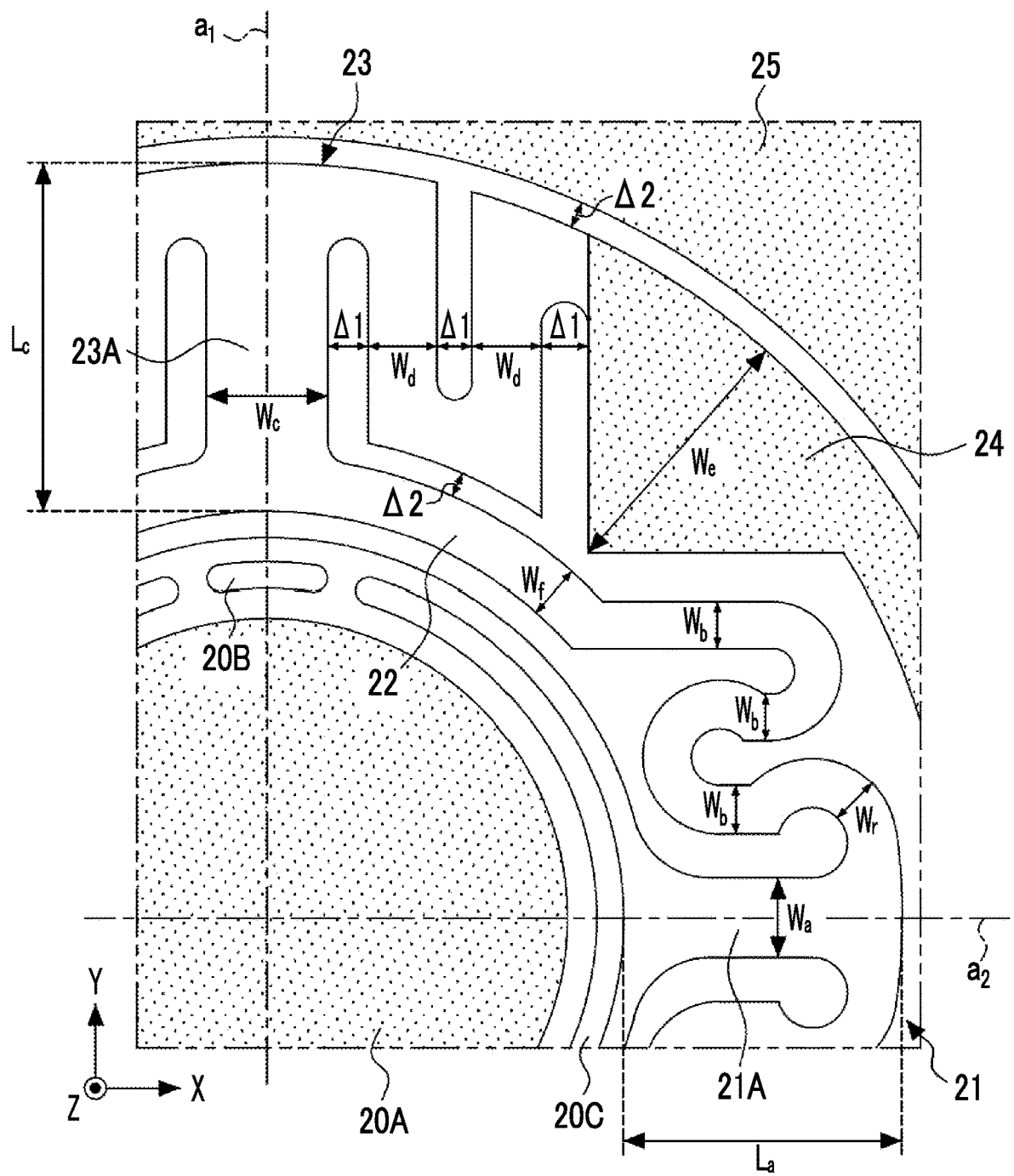
FIG. 15 is a diagram showing parameters relating to dimensions of components of the micromirror device according to Comparative Example.
Figure 16:
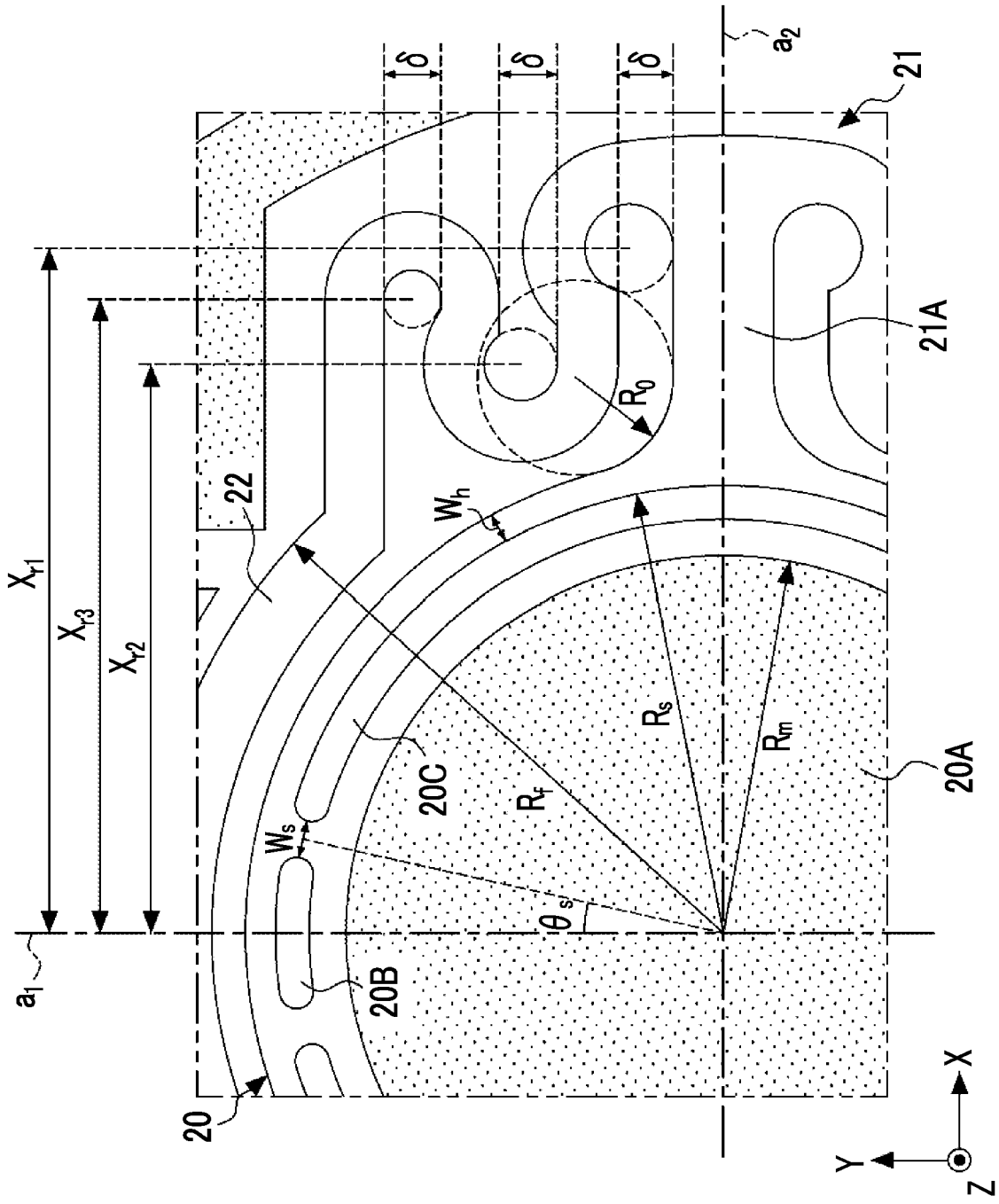
FIG. 16 is a diagram showing parameters relating to dimensions of components of the micromirror device according to Comparative Example.
Figure 17:
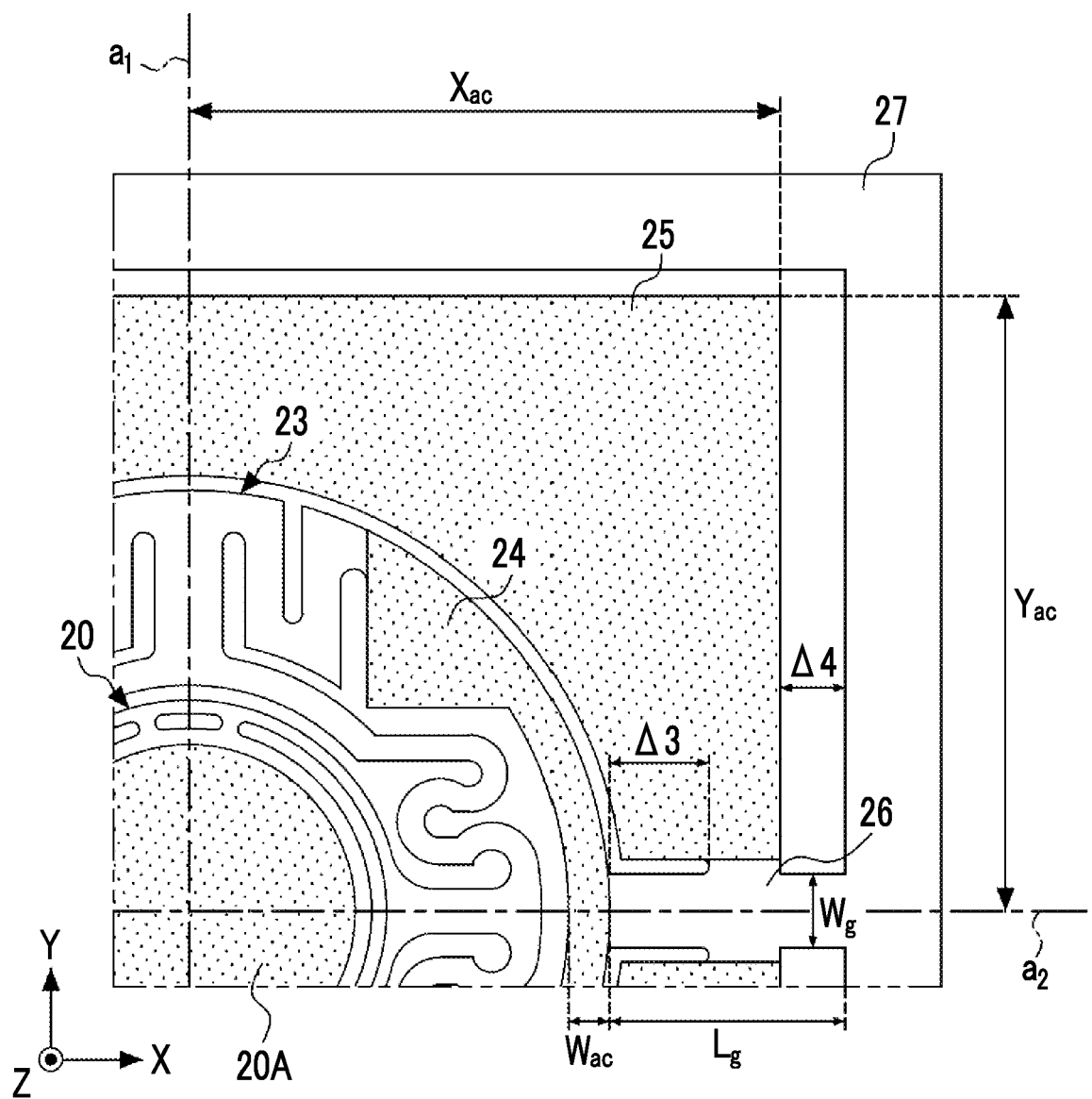
FIG. 17 is a diagram showing parameters relating to dimensions of components of the micromirror device according to Comparative Example.
Figures 18, 19:
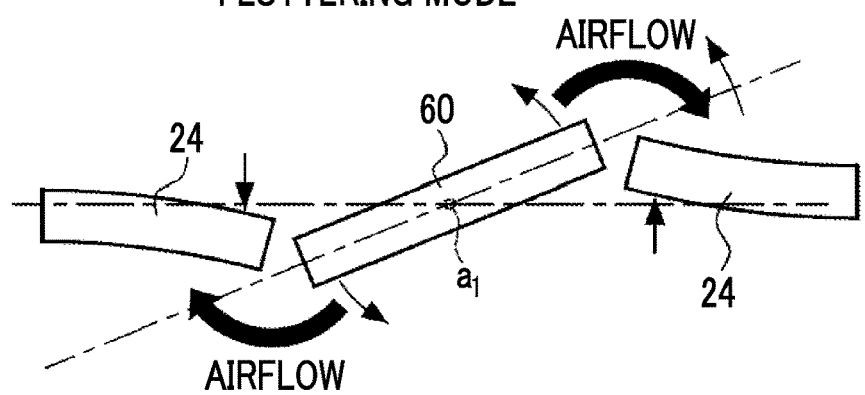
FIG. 18 is a diagram showing setting values of various parameters used in simulation.
FIG. 19 is a diagram showing an in-phase fluttering mode.

FIGS. 15 to 17 show parameters relating to the width, length, and the like of the components of the MMD 2A. FIG. 18 shows the set values of the parameters used in simulation. In the present simulation, only the first actuator 24 is driven without driving the second actuator 25. That is, the mirror portion 20 swings only around the first axis $a_1$.

As shown in FIG. 19, in the MMD 2A according to Comparative Example, the bending motion of the first actuator 24 occurs in the same phase with respect to the rotation of the movable portion 60 having the mirror portion 20. Hereinafter, this driving mode is referred to as an in-phase fluttering mode. In the in-phase fluttering mode, as in the in-phase rotation mode described above, the first actuator 24 is displaced toward the air flow, so that the bending motion is hindered by the air flow. That is, in the in-phase fluttering mode, the dissipated energy due to the airflow that hinders the bending motion of the first actuator 24 increases, and the Q value decreases.

In Comparative Example, as a result of performing simulation in the in-phase fluttering mode, the Q value in the atmosphere was "144". That is, in the in-phase fluttering mode according to Comparative Example, the Q value is lower than that in the anti-phase rotation mode according to the above embodiment, and an advantage over other methods cannot be obtained.

In the above embodiment, although a piezoelectric biaxial drive type micromirror device capable of allowing the mirror portion to swing around the first axis and the second axis is used, a piezoelectric uniaxial drive type micromirror device capable of allowing the mirror portion to swing only around the first axis may be used.

In the above embodiment, the hardware configuration of the driving controller 4 can be variously modified. The processing unit of the driving controller 4 may be composed of one processor or may be composed of a combination of two or more processors of the same type or different types. The processor includes, for example, a CPU, a programmable logic device (PLD), or a dedicated electric circuit. As is well known, the CPU is a general-purpose processor that executes software (program) to function as various processing units. The PLD is a processor such as a field programmable gate array (FPGA) whose circuit configuration can be changed after manufacture. The dedicated electric circuit is a processor that has a dedicated circuit configuration designed to perform a specific process, such as an application specific integrated circuit (ASIC).

All documents, patent applications, and technical standards mentioned in this specification are incorporated herein by reference to the same extent as in a case where each document, each patent application, and each technical standard are specifically and individually described by being incorporated by reference.

What is claimed is:

1. A micromirror device comprising:
   a movable portion having a mirror portion on which a reflecting surface for reflecting incident light is formed;
   a first support portion that is connected to the movable portion on a first axis located in a plane including the reflecting surface of the mirror portion in a stationary state, and that swingably supports the movable portion around the first axis;
   a pair of first actuators that are connected to the first support portion and face each other across the first axis, each of which being a piezoelectric drive type first actuator that allows the movable portion to swing around the first axis;
   a pair of second actuators that face each other across the second axis, each of which being a piezoelectric drive type second actuator that allows the mirror portion to swing around the second axis;
   a pair of first connecting portions that is disposed along the second axis, wherein each of which connects a first actuator of the pair of first actuators and a second actuator of the pair of second actuators on the second axis;
   a fixed frame that surrounds the pair of second actuators; and
   a pair of second connecting portions that is disposed along the first axis, wherein each of which connects a second actuator of the pair of second actuators to the fixed frame on the first axis,
   wherein in a case where the movable portion swings around the first axis, at least a part of each first actuator of the pair of first actuators swings around the first axis in a phase opposite to a phase of the movable portion, and
   assuming that a ratio of a rotation angle of the first actuator to a rotation angle of the movable portion is R, a O value when the mirror portion swings only around the first axis is Q, and a Q value when the mirror portion swings only around the first axis in a case where the displacement of the each first actuator is 0 is Qm, 0.12<R<0.80 and Q>1.2Qm are satisfied.

2. The micromirror device according to claim 1, wherein the movable portion includes
   a second support portion that is connected to the mirror portion on a second axis which is located in the plane including the reflecting surface of the mirror portion in the stationary state and is orthogonal to the first axis, and that swingably supports the mirror portion around the second axis, and a pair of movable frames that are connected to the second support portion and face each other across the second axis.

3. An optical scanning device comprising:

the micromirror device according to claim 1, and a processor that drives the pair of first actuators and the pair of second actuators, wherein the processor allows the mirror portion to resonate around the first axis and the second axis by providing a driving signal to the pair of first actuators and the pair of second actuators.

* * * * *